United States Patent
Fertner et al.

(10) Patent No.: US 9,313,112 B2
(45) Date of Patent: Apr. 12, 2016

(54) TEST DEVICE AND A METHOD FOR DETERMINING COMMUNICATION CHARACTERISTICS OF A METAL CABLE

(71) Applicant: Telefonaktiebolaget L M Ericsson (publ), Stockholm (SE)

(72) Inventors: Antoni Fertner, Stockholm (SE); Miguel Berg, Upplands Väsby (SE); Per Ola Börjesson, Lund (SE); Daniel Cederholm, Sollentuna (SE); Klas Ericson, Göteborg (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 231 days.

(21) Appl. No.: 14/113,890

(22) PCT Filed: Jun. 27, 2013

(86) PCT No.: PCT/SE2013/050796
§ 371 (c)(1),
(2) Date: Oct. 25, 2013

(87) PCT Pub. No.: WO2014/209180
PCT Pub. Date: Dec. 31, 2014

(65) Prior Publication Data
US 2015/0222511 A1    Aug. 6, 2015

(51) Int. Cl.
*G06F 11/00* (2006.01)
*H04J 1/16* (2006.01)
*H04L 1/00* (2006.01)
*H04L 12/26* (2006.01)
(Continued)

(52) U.S. Cl.
CPC .............. *H04L 43/0864* (2013.01); *H04B 3/46* (2013.01); *H04B 3/493* (2015.01); *G01R 27/32* (2013.01); *G01R 31/021* (2013.01); *G01R 31/11* (2013.01)

(58) Field of Classification Search
CPC ... H04L 43/0864; H04B 3/493; G01R 31/021
USPC ........................................ 370/250, 252, 254
See application file for complete search history.

(56) References Cited

U.S. PATENT DOCUMENTS

| 6,538,451 B1 | 3/2003 | Galli et al. |
| 6,724,859 B1 | 4/2004 | Galli |

(Continued)

OTHER PUBLICATIONS

Xiaolong Zhang et al: "Reconstruction of Faulty Cable Network Using Time-Domain Reflectometry", Progress in Electromagnetics Research, vol. 136, Jan. 1, 2013.*

(Continued)

*Primary Examiner* — Chuong T Ho
(74) *Attorney, Agent, or Firm* — Nicholson De Vos Webster & Elliott LLP (57) ABSTRACT

A method and a test device for determining communication characteristics of a metal cable suitable for use in a communication system are provided. The method comprises transmitting a wideband test signal on the metal cable; receiving a reflected signal as a result of the wideband test signal; and determining an interval of the reflected signal to be analyzed, the interval corresponding to a part of the cable length. The method further comprises approximating the reflected signal within the interval by a regression model; and determining characteristics of the metal cable based on the regression model.

28 Claims, 9 Drawing Sheets

(51) Int. Cl.
*H04B 3/46* (2015.01)
*H04B 3/493* (2015.01)
*G01R 31/02* (2006.01)
*G01R 27/32* (2006.01)
*G01R 31/11* (2006.01)

(56) References Cited

U.S. PATENT DOCUMENTS

| | | | | |
|---|---|---|---|---|
| 8,670,335 | B2* | 3/2014 | Barkan et al. | 370/252 |
| 2004/0230390 | A1 | 11/2004 | Galli et al. | |
| 2005/0163287 | A1 | 7/2005 | Ouyang et al. | |
| 2009/0024340 | A1* | 1/2009 | Borjesson | H04M 3/306 702/65 |
| 2009/0147695 | A1* | 6/2009 | Barkan et al. | 370/252 |
| 2009/0252054 | A1* | 10/2009 | Barkan et al. | 370/252 |
| 2011/0007664 | A1* | 1/2011 | Diab et al. | 370/254 |
| 2013/0242760 | A1* | 9/2013 | Peyton et al. | 370/250 |

OTHER PUBLICATIONS

International Search Report, Application No. PCT/SE2013/050796, Mar. 6, 2014, 1 page.

Zhang, Xiaolong, et al., "Reconstruction of Faulty Cable Network Using Time-Domain Reflectometry", Progress in Electromagnetics Research, vol. 136, 457-478, 2013, 22 pages.

International Preliminary Report on Patentability for Application No. PCT/SE2013/050796, mailed Jun. 12, 2015, 14 pages.

Basseville, Michele, et al., "Detection of Abrupt Changes: Theory and Application", 1993, 469 pages.

Clarke, Brooke, "Transmission Line Zo vs. Frequency", N6GCE 2003-2007, 19 pages, http://www.prc68.com/I/Zo.shtml.

Harris, Fredric J., "On the Use of Windows for Harmonic Analysis with the Discrete Fourier Transform", Proceedings of the IEEE, vol. 66, No. 1, Jan. 1978, 33 pages.

* cited by examiner

TEST DEVICE AND A METHOD FOR DETERMINING COMMUNICATION CHARACTERISTICS OF A METAL CABLE

TECHNICAL FIELD

The present disclosure relates to determining characteristics of a metal cable suitable for use in a communication system.

BACKGROUND

The increasing demand for quantity and speed of data constantly puts higher requirements on all available media for accommodating the increasing demand. Noticeably, data transmission at short distances is now a topic of great interest. In order to ensure the operation according to current technical standards and regulations, monitoring and diagnostics of the deployed network are necessary. Of course, the techniques applied should be reliable and relatively inexpensive.

Existing communication networks comprise e.g. copper cables, both newer and older copper cables. Depending on the quality of the cables, they are more or less capable of supporting both high speed data transmission and a large amount of concurrent data transmission.

One way of monitoring a link is determining a loop by means of which all loop components may be discovered, but determining their length and respective electrical parameters are still the challenging task. Certain methods are complementary or partly complementary to each other, like Single Ended Loop Test, SELT, and Double Ended Loop Test, DELT. SELT and DELT may be performed in both time and frequency domain. Mathematically they are equivalent since time and frequency domains are related through Fourier transform. Just for sake of explanation consider Time Domain Reflectometer (TDR). A short pulse is transmitted through the cable. Any impedance discontinuities will cause some of the incident signal to be sent back towards the source. This is similar in principle to the radar. The resulting reflected signal that is measured at the output/input to the TDR is displayed or plotted as a function of time and, because the speed of signal propagation is almost constant for a given transmission medium, can be read as a function of cable length. There are many quite complicated problems related to retrieving the information on network topology partly due to noise, partly to low accuracy, partly to imperfect model of cable.

SUMMARY

The object is to obviate at least some of the problems outlined above. In particular, it is an object to provide a method and a test device for determining communication characteristics of a metal cable suitable for use in a communication system. These objects and others may be obtained by providing a test device and a method performed by a test device according to the independent claims attached below.

According to an aspect, a method for determining communication characteristics of a metal cable suitable for use in a communication system is provided. The method comprises transmitting a wideband test signal on the cable; receiving a reflected signal as a result of the test signal; and determining an interval of the reflected signal to be analysed, the interval corresponding to a part of the cable length. The method further comprises approximating the reflected signal within the interval by a regression model; and determining characteristics of the cable based on the regression model.

According to an aspect, a test device adapted for determining communication characteristics of a metal cable suitable for use in a communication system. The test device comprises a transmitting unit adapted for transmitting a test signal on the cable; and a receiving unit adapted for receiving a reflected signal as a result of the test signal. The test device further comprises a determining unit adapted for determining an interval of the reflected signal to be analysed, the interval corresponding to a part of the cable length; and an approximating unit adapted for approximating or fitting the reflected signal within the interval by a regression model. Further, the determining unit is adapted for determining characteristics of the cable based on the regression model.

The test device and the method may have several advantages. The regression model provides information about characteristics of the cable. From a relatively small interval in relation to the whole cable length, information may be deduced relating to the characteristics of the whole cable or individual parts thereof. Further, any relatively large peak representing a local deviation from the regression model may indicate a possible fault in the cable or a joint of the cable. Still a possible advantage is that the method may allow identifying the type of metal cable.

BRIEF DESCRIPTION OF DRAWINGS

Embodiments will now be described in more detail in relation to the accompanying drawings, in which.

DETAILED DESCRIPTION

Briefly described, a test device and a method performed by the test device for determining characteristics of a metal cable suitable for use in a communication system are provided. By transmitting a test signal on the metal cable, a reflected signal is received. The reflected signal may then be analysed and examined in order to determine characteristics of the metal cable.

Exemplifying embodiments of such a method will now be described with reference to FIG. 1a.

Figure 1A:
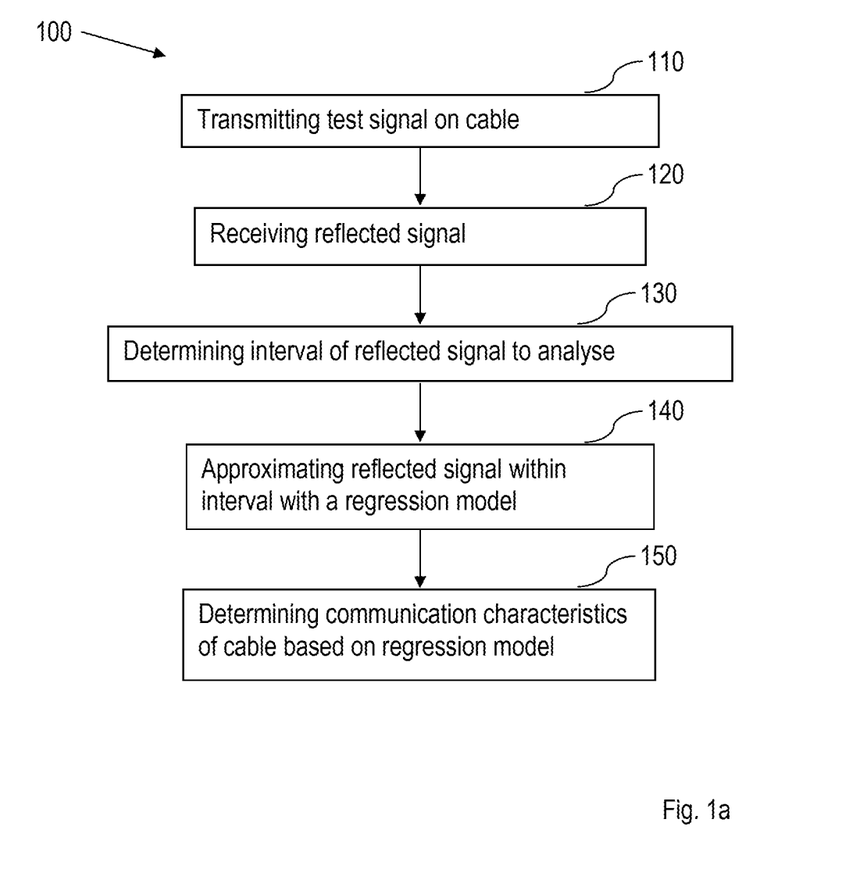
FIG. 1a is a flowchart of a method performed by the test device for determining characteristics of a metal cable suitable for use in a communication system according to an exemplifying embodiment.

FIG. 1a illustrates the method comprising transmitting 110 a wideband test signal on the cable; receiving 120 a reflected signal as a result of the test signal; and determining 130 an interval of the reflected signal to be analysed, the interval corresponding to a part of the cable length. The method further comprises approximating 140 the reflected signal within the interval by a regression model; and determining 150 characteristics of the cable based on the regression model.

Metal cables may have individual characteristics due to various different reasons. The individual characteristics may be due to the manufacturing process and that two metal cables may have approximately the same length and approximately the same radius or circumference, but due to impurities and imperfections already at manufacture, the individual characteristics of the two cables may be different. Naturally, the individual characteristics of cables of different lengths and different radiuses and circumferences may thus differ to an even greater extent.

Another reason for metal cables having individual characteristics may be due to the age of the cable or due to environmental causes.

Still another reason for individual cables having individual characteristics may be due to variation of conductor diameter, spacing between conductor pairs, variations in dielectric constant, wire thickness and fluctuations of the characteristic impedance along the transmission line, i.e. the length of the cable.

A loop may comprise several metal cables running between two endpoints, actually it may comprise a plurality of segments of metal cables. Further it may comprise joints between different segments.

In order to test the metal cable, the method comprises transmitting the wideband test signal on the cable. The metal cable may be any metal cable, it may be above ground, dug down and buried in the ground, old, new and so on. The length of the cable may be known or unknown.

The method may be performed by a test device, which is connectable to one end of the metal cable. Once the test device is connected to the cable, the test signal is transmitted 110 on the cable. The transmission of the test signal could be triggered from e.g. a management system. The test signal travels down the cable and as the test signal travels down the cable, fractions of the test signal will be reflected towards the test device. The reflected fractions of the test signal are due to imperfections, impurities, inhomogeneities and the like which are present in the metal cable along its length. All the reflected fractions are then received 120 at the test device and they all form the reflected signal. The reflected signals may also be referred to as inhomogenity induced reflections.

The method also comprises determining 130 an interval covering a part of the reflected signal to be analysed, the interval corresponding to a part of the cable/segment length.

The method further comprises approximating 140 the reflected signal within the interval by a regression model. A regression model may be used to describe the variation in one (or more) variable(s) when one or more other variable(s) vary. A regression model may comprise many techniques for modelling and analysing several variables or fractions of the test signal.

Once the reflected signal has been described by the regression model, the method comprises determining 150 characteristics of the cable based on the regression model.

The reflected signal is always analyzed and interpreted in time domain. Therefore, in case a test signal is designed and transmitted in frequency domain, then the reflected signal may be subjected to Inverse Fast Fourier Transform, IFFT, in order to obtain a corresponding signal in the time domain.

The method may have several advantages. The regression model provides information about characteristics of the cable. From a relatively small interval in relation to the whole cable length, information may be deduced relating to the characteristics of the whole cable or individual parts thereof. Further, any relatively large peak representing a local deviation from the regression model may indicate a possible fault in the cable or a joint of the cable. Still a possible advantage is that the method may allow identifying the type of metal cable.

According to an embodiment, the regression model is defined by a function, f(x).

Thus, by analysing an interval of the reflected signal indicative of the communication characteristics, the communication characteristics of a larger part, if not all, of the cable may be described by a function.

The metal cable characteristics may be at least one of attenuation and homogeneity.

There may be several aspects of cable characteristics, which may be indicative of how a signal is affected after passing through the cable. Typically, a signal transmitted from one end of the cable to a second end of the cable will be distorted due to attenuation, dispersion, spurious reflections, additive noise, etc. The regression model allows interpreting relevant information about the actual loop based on measurement data, i.e. the reflected signal.

According to an embodiment, the regression model or regression function is a linear regression function.

When the regression model or regression function is a linear regression function, i.e. a first order polynomial, the reflected signal received at the test device may be approximated by a line. A line is easy to extrapolate to extend beyond the interval used for determining the regression model, e.g. for the first order polynomial. In other words, when the regression model or regression function is a first order polynomial, a relatively small interval may be used for approximating, which then may be extrapolated to possibly represent the whole metal cable that is tested or measured. It shall be pointed out that the regression model or the regression function may alternatively be a second, third or any other order polynomial, wherein the reflected signal received at the test device may be approximated by a line.

According to yet an embodiment, the method further comprises determining, based on the regression model, whether the cable comprises one segment or at least two distinct segments differing in attenuation and/or homogeneity.

In case the metal cable consists of one or more segments coupled together by individual joints, each joint typically induces a loss or otherwise affect the characteristics of the metal cable. By identifying points or fractions of the reflected test signal representative of joints, information may be obtained of the different segments of the metal cable. For example, a joint between two segments results in a distinct loss which is detectable by a relatively large reflection. In other words, at the joint, a relatively large fraction of the test signal may be reflected back towards the test device. In the reflected signal at the test device, this results in a sudden, or deviating, peak. Hence, the joint may be detected by the test device. Consequently, the cable comprises one segment before the joint and a second segment after the joint. By before and after is meant that the reflected signal may be illustrated or plotted in a graph and the x-axis may define either time or length of the cable, and "before" means to the left of the sudden, or deviating, peak in the reflected signal in the graph and "after" means to the right of the sudden, or deviating, peak in the reflected signal.

By determining a plurality of intervals, one for each segment, a respective regression model may be defined for each interval. This will be explained in more detail below.

The test signal is in an example a wideband signal.

Diverse imperfections, impurities and/or inhomogeneities which reflect fluctuations of the electrical parameters of twisted pair in time-space domain affect in their own way the frequency spectrum of the test signal. The wideband signal should be wide enough to enable a satisfactory distance resolution. Thus, in order to get a reflected signal permitting the best attainable resolution in time-space domain, the test signal is a wideband signal comprising a large range of different frequencies, e.g. from several kHz up to hundreds MHz.

Determining 150 the cable characteristics may comprise determining an attenuation per length unit of the cable neglecting polynomial terms of higher order than one.

Assume the regression function defining the regression model is expressed as a function f(x) where the parameter x is length of the cable and the result of the function f(x) is magnitude of reflected signal in dB at cable length x. Assume further, for simplicity, that the function f(x) is a first order polynomial, i.e. any polynomial terms of higher order than one are neglected or disregarded.

Thus, the coefficient at polynomial term of order one is a slope of the line defined by f(x). The slope corresponds, or relates, to the attenuation per length unit of the cable.

Subtracting the magnitude in dB of a reflected signal at point A with the magnitude in dB of the reflected signal at a subsequent point B gives a value of the attenuation between the two points. Dividing this attenuation by the length of the cable between point A and point B results in attenuation per length unit of the cable. When the attenuation of the reflected signal between point A and point B may be represented by a first order polynomial, the derivative of the function results in the slope of the line, i.e. the attenuation per length unit of the cable.

A relatively steep slope of the line indicates a relatively high attenuation. Likewise, a slowly decaying line indicates a relatively low attenuation.

According to an embodiment, the regression model is defined by $f(x)=C_1x+C_2$.

Since the test signal will be attenuated when travelling down the metal cable from the test device towards the other endpoint of the cable, the reflected signal will be weaker the further away from the test device the fraction of the reflected test signal is coming from. Thus, in case of the reflected signal illustrated in a graph, and if the reflected signal is approximated by a linear regression function, the slope will have a negative value since the magnitude of reflected signal is declining the further into the cable the test signal propagates.

Figure 1B:
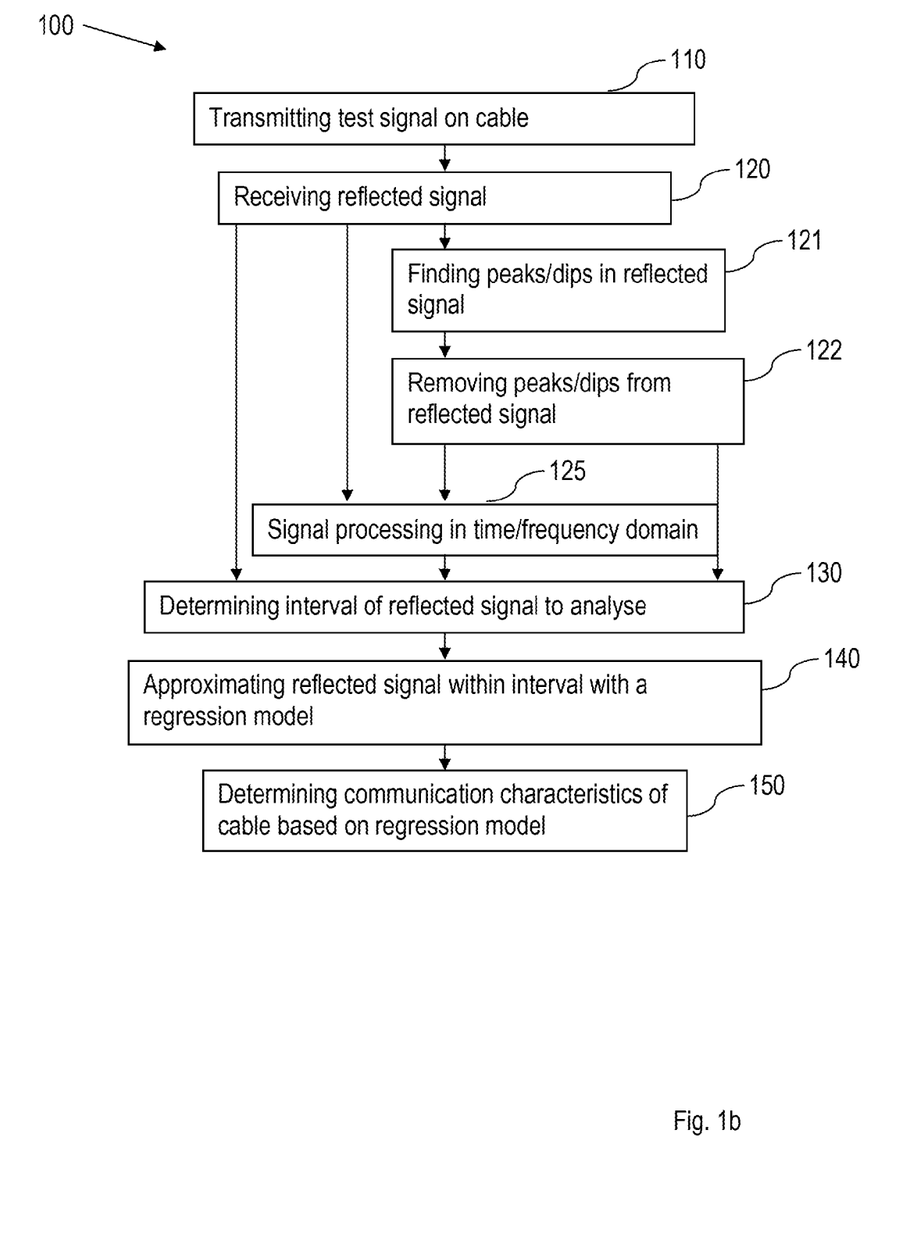
FIG. 1b is a flowchart of a method performed by the test device for determining characteristics of a metal cable suitable for use in a communication system according to yet an exemplifying embodiment.

The method may further comprise estimating 160 the value of f(x) for a cable length of zero, i.e. f(0), and determining 170 the characteristics of the cable based on the value of f(0).

The value of f(0) is another measure of characteristics of the cable. The f(0) is representative of an average (expected value) of the magnitude of a first reflection within the metal cable. Thus, when f(0) is relatively high, then impedance fluctuation due to the manufacturing process is high i.e. variation of conductor diameter, spacing between conductor pairs, variation in dielectric constant, etc. In other words the quality of the cable is poor. In contrary, when f(0) is relatively low, the accuracy of manufacturing is high, which means the cable is of better quality. The physical phenomenon may be explained as follows. If one compares a cable with high quality with a cable of inferior quality, then the proportionally smaller portion of transmitted signal is reflected within a cable of high quality than within a low quality. This is due to fact that fluctuation of the characteristic impedance within a cable of high quality is lesser then in a cable of low quality.

According to an embodiment, the method further comprises compensating for an impedance mismatch between the metal cable and a measurement arrangement.

An impedance mismatch between the metal cable and a measurement arrangement may cause an increase in reflection at the input end of the cable, i.e. the end in which the test signal is transmitted from the test device on the cable.

By compensating for the impedance mismatch, the impedance of the test device, or measurement arrangement, is adjusted to match the impedance of the metal cable.

According to still an embodiment, determining 130 the interval comprises determining a noise floor level, wherein the interval is determined within a part of the reflected signal above the noise floor level.

Depending on the cable length, there may be a point along the cable from the test device where reflected fractions of the test signal suffer so much attenuation on their way back towards the test device that they drop under the noise floor level. The noise floor is the measure of the signal created from the sum of all the noise sources and unwanted signals within a measurement system, where noise is defined as any signal other than the one being monitored.

Therefore, the interval in which the reflected signal is to be approximated by the regression model should be above the noise floor level in order to obtain a meaningful result. In order to determine a suitable interval to use for this approximation, the noise floor level is determined and then the interval to be analysed and approximated by the regression model may be determined.

According to still an embodiment, the method further comprises finding 121 peeks in the reflected signal corresponding to a joint or an end point of the cable and removing 122 said peeks from the reflected signal before approximating 140 the reflected signal within the interval by the regression model.

As described above, joints may cause an extra strong reflected fraction of the test signal. This extra strong reflected fraction or fractions of the test signal may be seen in the reflected signal as a distinct, deviating peek. There may also be other reasons for peeks in the reflected signal. If such peeks are present within the estimation interval the estimation can be negatively affected. Hence, in order to obtain a more accurate value of the slope within the interval, the peeks should be removed before approximating the reflected signal with the regression model.

The method may further comprise signal processing either in time or frequency domain before determining 130 the interval of the reflected signal to be analysed.

By signal processing in the time domain it may be possible to detect abrupt changes [1] indicating discontinuities due to joints and/or faults; to determine estimation intervals; to determine noise floor level, etc. By signal processing in the frequency domain, e.g. by means of windowing [2] it may be possible to improve signal to noise ratio.

The method may still further comprise determining a residual of the regression model and a variance of the determined residual.

The residual is the difference between an observed value and the value calculated from the estimated theoretical model, e.g. the regression model. The variance of the determined residual is another measure of communication characteristics of the cable.

A relatively high variance of the residual indicates a low quality cable, and in contrary, relatively low variance of the residual indicates that the cable is of high quality.

The method may further comprise determining a normalised impedance profile based on the residual which will be explained in more details below.

The test signal may be one of a Time Domain Reflectometry, TDR, pulse, frequency swept sinus wave signal, pseudo-random noise signal, multicarrier signal with random phase.

There may be several different wideband signals that may be used as the test signal. One example is the short pulse. TDR is a measurement technique used to determine the characteristics of a cable where a short pulse is transmitted on a cable and the reflected signal is analysed.

Another example is the pseudo-random noise signal which is a signal similar to noise which satisfies one or more of the standard tests for statistical randomness. Pseudo random noise consists of a deterministic sequence of pulses but lack any specific pattern. Just as the TDR, fractions of the deterministic sequence of pulses may be reflected back to the test device and analysed to determine characteristics of the cable.

A multicarrier signal is a signal comprising multiple frequencies. Just as for the other examples, when the test signal is a multicarrier signal with random phase, fractions of the test signal will be reflected back towards the test device and analysed as described above. Carrier phase randomisation may significantly reduce the crest factor, or the peak-to average ratio.

The embodiments described above enable determining an attenuation of a loop from a plain SELT measurement. If the loop comprises several segments, i.e. part of the cable joined together by e.g. joints, the individual attenuation associated with each respective segment may be determined, as well as the individual length of each segment. The embodiments further enable classification of the cable by which it is meant to distinguish between various cable types, for instance AWG24 and category 5, etc. AWG24 is a lower quality cable than a category 5 cable. The embodiments also enable determining/introducing a quality measure, understood as a combination of slope, power shift (vertical shift) and variance of residuals of the reflected signal. The time track of each individual segment of the cable is unique and characteristic for each individual segment. Hence all segments may be "personalised" (finger prints, maybe even batch identification). The embodiments also enable easy detection of faults in or on the cable, changes in time by comparing a reflected signal to a reference measurement.

Below, a mathematical description and explanation is given for the method described above.

As described above, the test signal is applied into one end of the cable and propagates through the cable towards a second end of the cable. When the test signal travels down towards the second end of the cable, small portions or fractions of the test signal are reflected back towards the test device. Each reflected portion of the test signal reduces the transmitted energy of the test signal while reversing propagation of a portion of the electromagnetic wave in the opposite direction, towards the test device.

The metal cable, e.g. a copper cable, may be considered as a scattering medium, where each change of characteristic impedance constitutes a reflection point. The reflection points may be randomly located along the cable and they may cause reflections of different magnitude and polarity. The magnitude of reflection, i.e. the size of the fraction of the test signal being reflected, caused by the reflection points depends partly on the magnitude of change of the characteristic impedance which is directly associated to the reflection coefficient, $\rho$, and partly on scattering paths. For modern high quality cables, the variation of the characteristic impedance is smaller compared to older cables of lower quality and thus the reflection coefficients are smaller for modern high quality cables than those for older cables of lower quality.

The nature of changes may also be diverse e.g. they may be continuous or they may be discrete with piecewise constant characteristic impedance, isolated reflection points etc. Therefore, it is assumed that the reflection coefficient may be in best way characterized as a random variable with a finite mean value and variance. The variance in reflection coefficients is a major source of statistical error as it is superimposed on the line attenuation slope. Otherwise it produces a characteristic pattern by which each cable may be identified.

Another important factor that may influence the accuracy of the result is resolution. The wider the bandwidth, the smaller the features that may be resolved.

Thus, using Very high-rate Digital Subscriber Line, VDSL, and G.fast frequency range, it becomes possible to extract more properties compared to when dealing with, Asymmetric Digital Subscriber Line, ADSL frequency range. Also note, that filters which are designed to improve Signal to Noise Ratio, SNR, within ADSL frequency range, not necessarily improve the resolution. To the contrary, the filters may even decrease the resolution with deleterious effect.

Figure 2A:
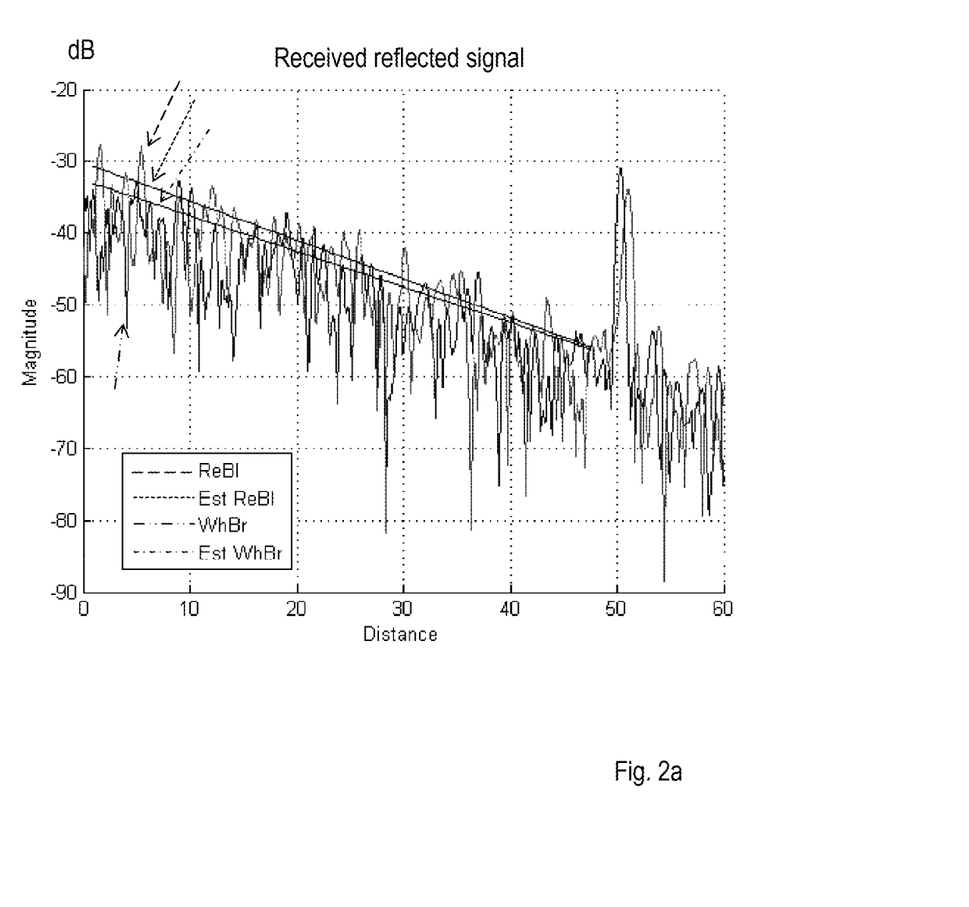
FIG. 2a is a graph illustrating the reflected portion of a test signal transmitted on two different twisted pairs of the same cable: Red-Blue and White-Brown.

To illustrate the method, a typical reflected signal as shown in FIG. 2a is studied. FIG. 2a is a graph illustrating the reflected portion of a test signal transmitted on two different pairs of the same cable: Red-Blue and White-Brown. They exhibits similar electrical properties; note a difference in electrical length due to a little different twist. Within a particular cable, each pair will have different twist lengths based on prime numbers so that no two twists ever align. Compared to a cable made up with all pairs using the same twist the cross talk is reduced. Cable twisting length is not standardized, the amount of twists per pair is usually unique for each cable manufacturer, [3]. FIG. 2a illustrates that by the regression function, the reflected signal may be approximated by a line, or lines, whereas relative positions of strong reflections at the far ends are indicative of e.g. ratio of twists of twisted pair cables.

It is assumed that a test signal has been transmitted on the cable and the reflected signal is received at the test device as a result of the transmitted test signal. The line of the graph in FIG. 2a illustrates how the reflections are attenuated with time, equivalently with distance along the cable, equivalent to the number of samples. FIG. 2a is the initial portion of a reflected signal. It can be seen that the line declines from the first sample until about sample 500, where the noise floor level is reached. It can also be seen that there is a peak in the reflected signal observed at about sample 300 which may indicate a joint of two metal cable segments or a reflection from the other end of the metal cable. It may be noted that the coefficient corresponding to the attenuation of the first segment of the line is stable despite different geometries.

Figure 2B:
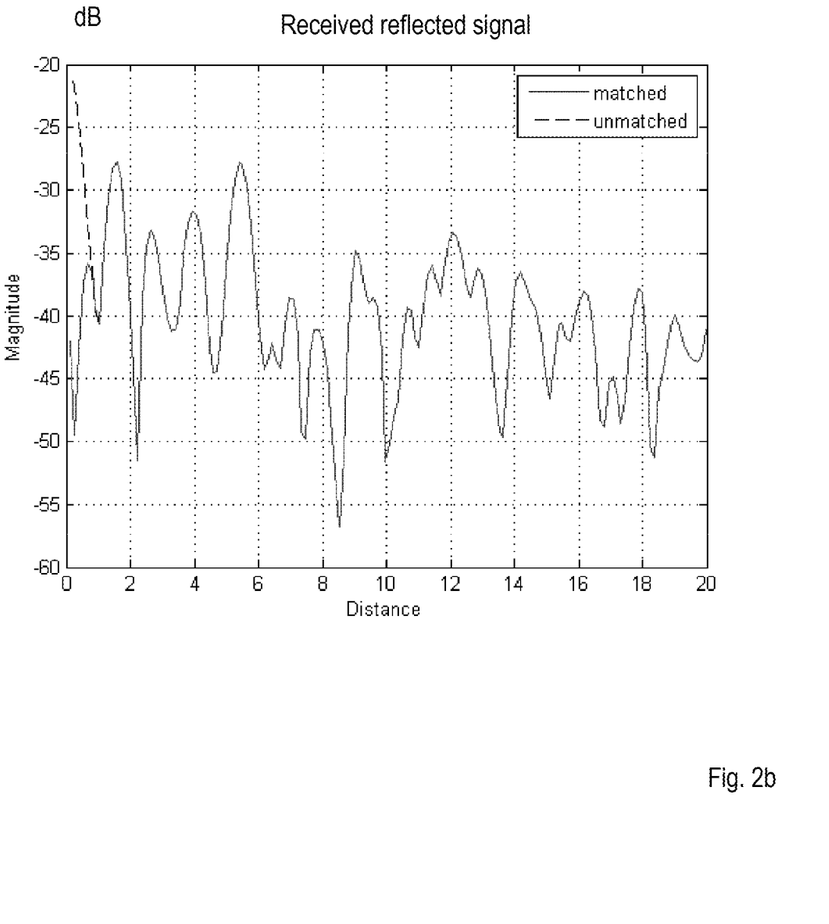
FIG. 2b is a graph illustrating the reflected portion of a test signal transmitted on a cable having an open end in greater detail, specifically at the beginning of TDR.

FIG. 2b is a graph illustrating the reflected portion of a test signal transmitted on a cable having an open end in greater detail, specifically at the beginning of the TDR. FIG. 2b also illustrates the difference between matched impedance and unmatched impedance.

Figure 2C:
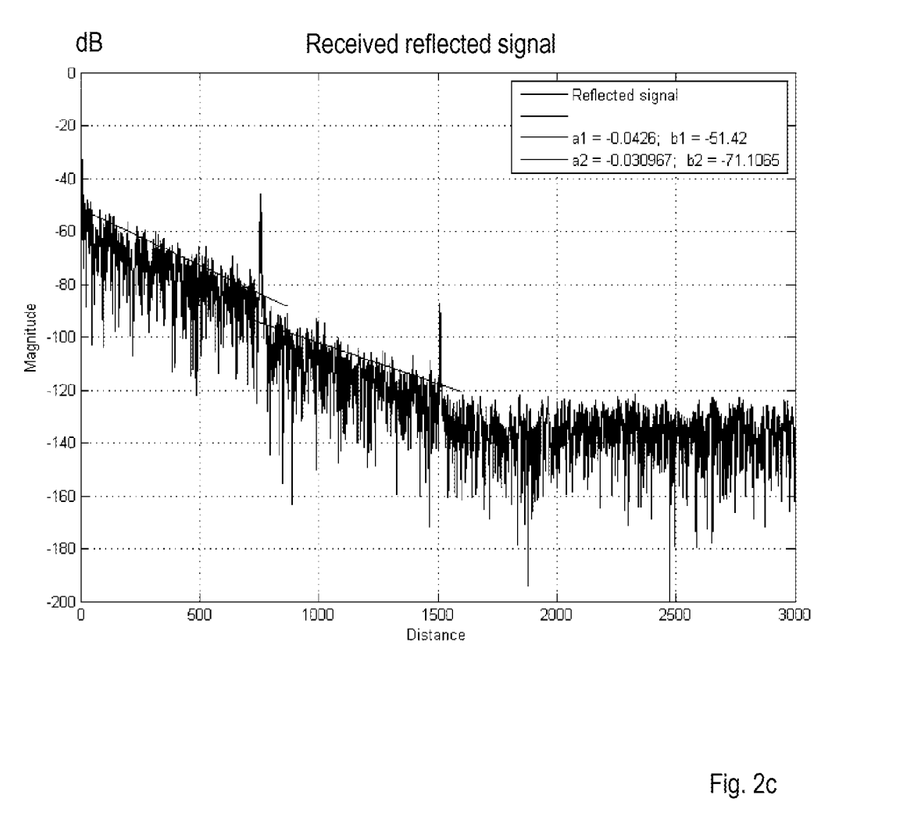
FIG. 2c is a graph illustrating the reflected portion of a test signal transmitted on two cable segments in series.

FIG. 2c is a graph illustrating the reflected portion of a test signal transmitted on two cable segments in series. Note the different slopes corresponding to different segments. In FIG. 2c, the reflected signal has been approximated by a regression model, which is a linear regression function, f(x). The slope of the line or lines is denoted $a_1$ and $a_2$ respectively and the value of f(0) is denoted $b_1$ and $b_2$ respectively.

Figure 2D:
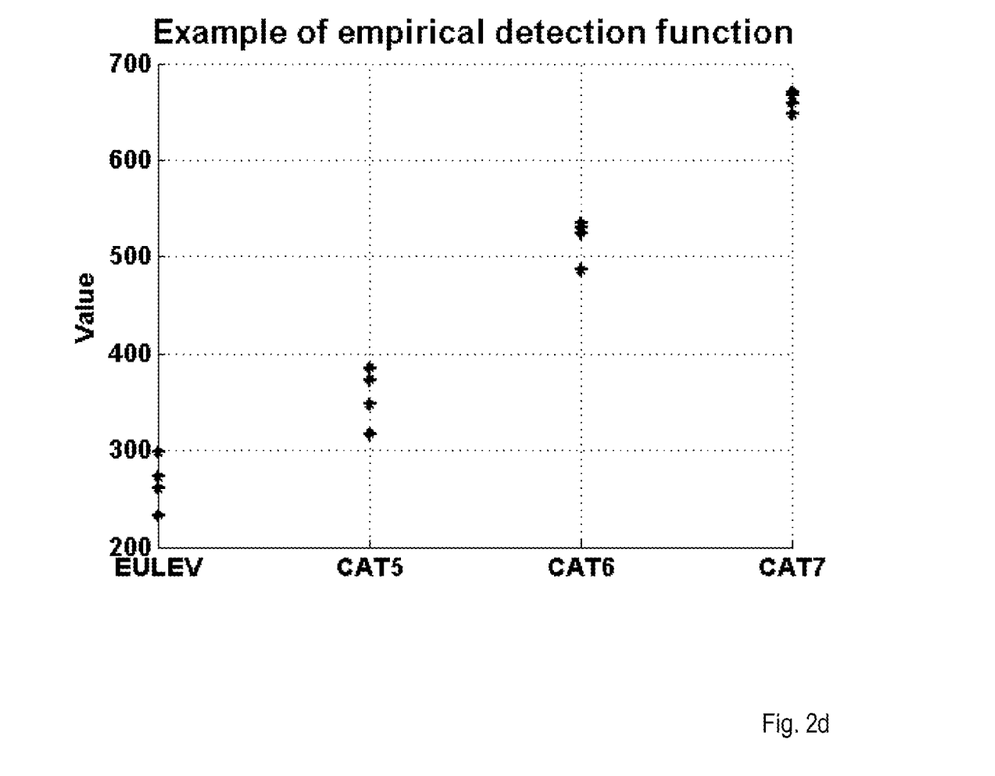
FIG. 2d is a graph illustrating the identification of the type of cable using an artificial function combining measured parameters. Function value gives cable type.

FIG. 2d is a graph illustrating the identification of the type of cable using an artificial function combining measured parameters. The different function value gives an indication of the cable type.

Figure 2E:
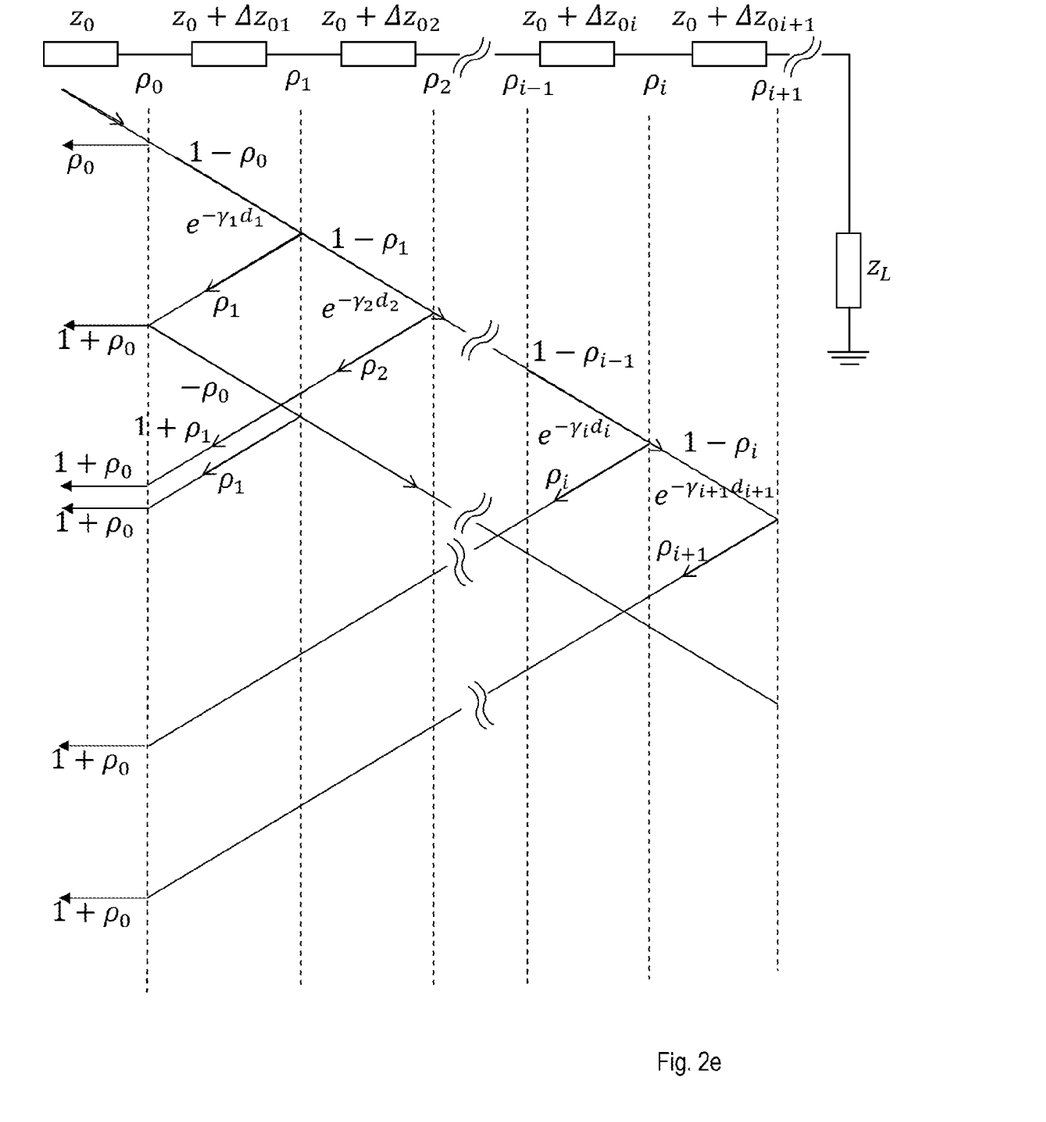
FIG. 2e is an illustration of a physical interpretation of the reflected signal.

FIG. 2e is an illustration of a physical interpretation of the reflected signal.

Any in-homogeneity (non-uniformity) of the cable is assumed to be approximated by a piecewise stepping function. Accordingly the cable, or transmission line, is divided into infinitesimal homogeneous segments (IHS). The distance between the reflections points (length of the segments) is assumed to follow Gaussian probability distribution function, with certain average distance and variance. Without losing generality, assume that variance is negligibly small. Hence, the i-th contribution, $v_i$, arriving at the time $t_i$ can be expressed as follows:

$$v_i = \rho_i * \prod_{k=0}^{i-1} (1 - \rho_k^2) * e^{-2\gamma_k d_k} * \delta\left(t - 2 * \sum_{k=0}^{i} \frac{d_i}{v_1}\right), \quad (1)$$

where $\delta$ represents Kronecker delta, $\gamma_k$ is a propagation constant for the kith line segment and $d_k$ is its corresponding length, i, k are indexes denoting number of the subsequent infinitesimal homogeneous segment, while always k<i.

The electromagnetic wave propagating through a consecutive IHS of the transmission line is exponentially attenuated by a factor of $e^{-2\gamma_k d_k}$. Just for the purpose of explanation but without the loss of generality, the reflection coefficients are assumed to be real. More importantly, but practically justified, is an assumption that multiple reflections may be neglected as being at least $\rho_m * \rho_n$ times smaller than the "main reflection" as depicted by equation (1), indices m,n<i are arbitrarily chosen. When successive backscattered contributions, $v_i$, are represented in a logarithmic graph, they represent basically a straight line. Assumption of the small variation of the characteristic impedance is an equivalent to assumption of small reflection coefficients, $\rho_i$. Consequently:

$$\log(v_i) = \log(\rho_i) + \Sigma_{k=0}^{i-1} \log(1-\rho_k^2) - 2*\Sigma_{k=0}^{i-1}\gamma_k d_k \quad (2)$$

The last term in equation (2), $$-2*\Sigma_{k=0}^{i-1}\gamma_k d_k \quad (3)$$

represents the accumulated line or cable attenuation at a time instant corresponding to propagation of the reflected signal back and forth from IHS. Note that the time instants $t_i$ are randomly spread in time, practically identically as distances between the reflections points.

The second term in equation (2) may be neglected under the assumption that the reflection coefficients, $\rho_i$, are small. Serial expansion of the second term in equation (2) gives:

$$\sum_{k=0}^{i-1} \log(1 - \rho_k^2) = \sum_{k=0}^{i-1}\left(\rho_k^2 + \frac{\rho_k^4}{2} + \frac{\rho_k^6}{3} + o(\rho_k^8)\right) \approx -\sum_{k=0}^{i-1} \rho_k^2 \quad (4)$$

Using the Steiner theorem results in:

$$-2*\Sigma_{k=0}^{i-1}\rho_k^2 = -i*(|\rho|_{mean}^2 + \sigma^2) \quad (5)$$

It is assumed that the reflection coefficient is a random variable and may be expressed as:

$$\rho = |\rho|*e^{i*\phi}, \quad (6)$$

where $\phi$ may have arbitrary probability distribution function (pdf) while $|\rho|$ has normal distribution with mean value $|\rho|_{mean}$ an variance $\sigma^2$ $$pdf(\rho) = \frac{1}{\sigma * \sqrt{2*\pi}} * e^{-\frac{1}{2}*\left(\frac{|\rho|-|\rho|_{mean}}{\sigma}\right)^2} \quad (7)$$

Thus equation (2) may be simplified to:

$$\log(v_i) = \log(\rho_i) - i*(|\rho|_{mean}^2 + \sigma^2) - 2*\Sigma_{k=0}^{i-1}\gamma_k d_k \quad (8)$$

In reality, for the low quality lines or exceptionally long lines, a shift down due to non-negligible influence of the second term may be observed.

In the rather unlikely case when the absolute value of the reflection coefficient, $\rho$, is constant, i.e. $\sigma^2=0$, the reflection coefficient, $\rho$, represents a bias. For higher values of the reflection coefficient, $\rho$, the line drawn in FIGS. 2b and 2c approximated with a straight line is shifted vertically up whereas for lower values it is shifted down. The same applies to mean value of reflection coefficients $|\rho|_{mean}$. Apparently then, for the lower, respective higher mean values of the magnitude of the reflection coefficient, the straight line drawn in FIGS. 2b and 2c, is moved down or moved up.

Random fluctuation of equation (7) is modified by a non-linear operation of logarithm to represent a ripple. A procedure to compensate for lack of symmetry is proposed below. Expressing reflection coefficient as:

$$\rho_i = \frac{\frac{z_i}{z_0} - 1}{\frac{z_i}{z_0} + 1} \quad (9)$$

gives $$\text{residual\_ripple} = \ln(\rho_i) = \ln\left(\frac{\frac{z_i}{z_0} - 1}{\frac{z_i}{z_0} + 1}\right) \quad (10)$$

which, with some manipulations gives:

$$\frac{z_i}{z_0} = \frac{1 + e^{residual\_ripple}}{1 - e^{residual\_ripple}} \quad (11)$$

Equation (11) is a representation of the normalised impedance profile.

The increase of impedance towards the test device gives a negative reflected signal. To the contrary, an increase of impedance towards the metal cable gives a positive reflected signal. A transition from higher to lower impedance results in a smaller amplitude of the reflection coefficient than a transition from lower to higher impedance.

Embodiments herein also relate to a test device adapted for determining characteristics of a metal cable suitable for use in a communication system. The test device has the same technical features, objects and advantages as the method described above. The test device will be described in brief in order to avoid unnecessary repetition.

Figure 3:
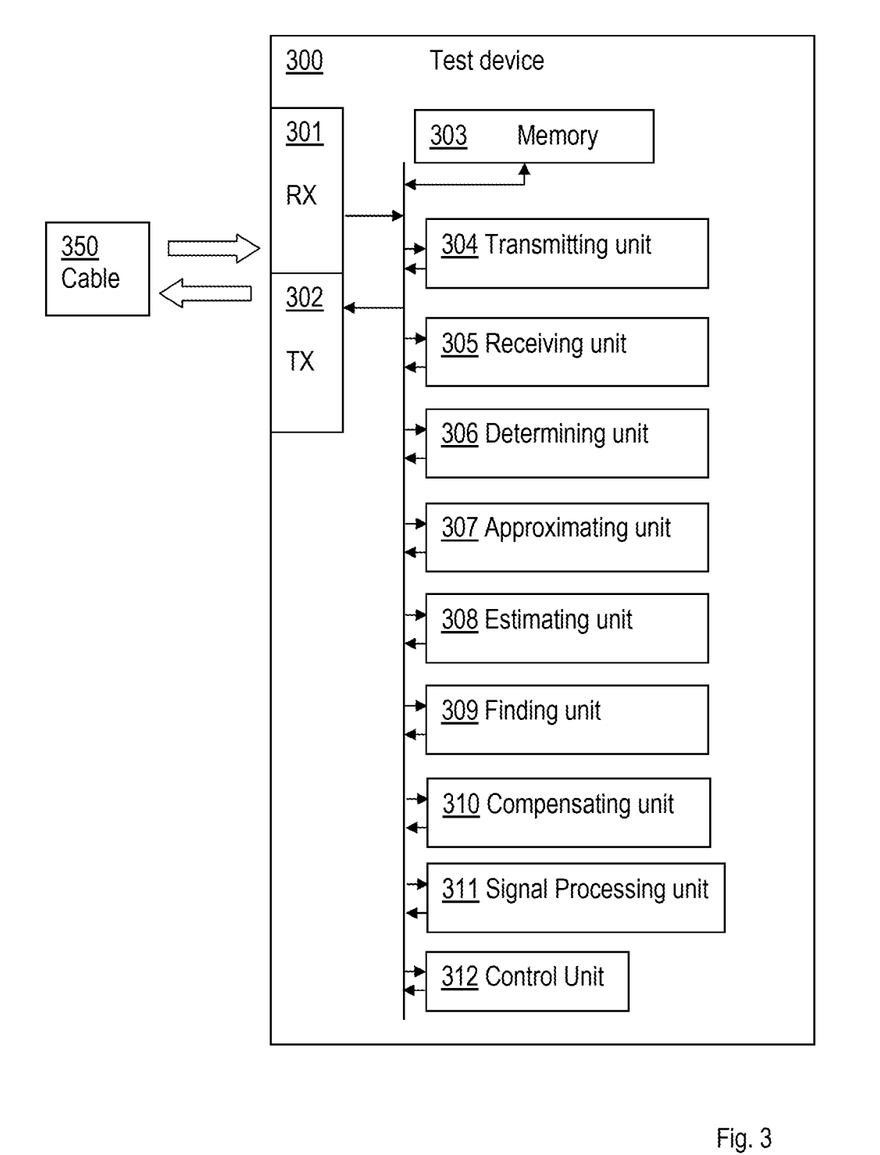
FIG. 3 is a block diagram of a test device adapted for determining characteristics of a metal cable suitable for use in a communication system according to an exemplifying embodiment.

Embodiments of such a test device will now be described with reference to FIG. 3. FIG. 3 illustrates the test device 300, adapted for determining characteristics of a metal cable suitable for use in a communication system, comprising a transmitting unit 304 adapted for transmitting a test signal on the cable; and a receiving unit 305 adapted for receiving a reflected signal as a result of the test signal. The test device further comprises a determining unit 306 adapted for determining an interval of the reflected signal to be analysed, the interval corresponding to a part of the cable length; and an approximating unit 307 adapted for approximating or fitting the reflected signal within the interval by a regression model. Further, the determining unit 306 is adapted for determining characteristics of the cable based on the regression model.

The test device may have the same advantages as the method for determining characteristics of a metal cable suitable for use in a communication system. The regression model provides information about characteristics of the cable. From a relatively small interval in relation to the whole cable length, information may be deduced relating to the communication characteristics of the whole cable. Further, any relatively large peak representing a local deviation from the regression model may indicate a possible fault in or joint of the cable. Still a possible advantage is that the device may allow identifying the type of metal cable.

According to an embodiment, the regression model is defined by a function, f(x)

The communication characteristics may be at least one of attenuation and homogeneity.

The regression model or regression function may further be a linear function, i.e. a first order polynomial.

In an example, the determining unit 306 is adapted for determining, based on the regression model, whether the cable comprises one segment or at least two distinct segments differing in attenuation and/or homogeneity.

The test signal may be a wideband signal.

According to an embodiment, the determining unit 306 is adapted for determining the communication characteristics by determining an attenuation per length unit of the cable neglecting polynomial terms of higher order than one.

The regression model may be defined by $f(x)=C_1 x+C_2$.

In still an example, the test device further comprises an estimating unit 308 adapted for estimating the value of f(x) for a cable length of zero, i.e. f(0), wherein the determining unit 306 is adapted for determining the communication characteristics of the cable based on the value of f(0).

In still an example, the test device further comprises a compensating unit 310 adapted for compensating for an impedance mismatch between the metal cable and a measurement arrangement, which measurement arrangement is used for performing the method.

Further, the determining unit 306 may be adapted for determining the interval by determining a noise floor level, wherein the interval is determined within a part of the received reflected signal above the noise floor level.

According to an embodiment, the test device further comprises a finding unit 309 adapted for finding peeks and/or dips in the received reflected signal corresponding to a joint or an end point of the cable and for removing said peeks and/or dips from the received reflected signal before the approximating unit 307 approximates the received reflected signal within the interval by the regression model.

Still further, the test device may comprise a filtering unit 311 adapted for filtering the received reflected signal before the determining unit 306 determines the interval of the received reflected signal to be analysed.

The determining unit may be adapted for determining a residual of the regression model and a variance of the determined residual.

The determining unit may still further be adapted for determining a normalised impedance profile based on the variance of the residual.

In an example, the test signal is one of a Time Domain Reflectometry, TDR, pulse, frequency swept sinus wave signal, pseudo-random noise signal, multicarrier signal with random phase.

In FIG. 3, the test device 300 is also illustrated comprising a receiving unit 301 and a transmitting unit 302. Through these two units, the test device 300 is adapted to be coupled to the metal cable for transmitting the test signal and receiving the reflected signal. The receiving unit 301 may comprise more than one receiving arrangement. For example, the receiving unit may be connected to a wire, by means of which the test device 300 is enabled to receive a reflected signal from the metal cable. Similarly, the transmitting unit 302 may comprise more than one transmitting arrangement, which in turn is connected to a wire, by means of which the test device 300 is enabled to transmit a test signal on the metal cable. The test device 300 further comprises a memory 303 for storing data. Further, the test device 300 is illustrated comprising a control or processing unit 312 which in turns is connected to the different units 304-311. It shall be pointed out that this is merely an illustrative example and the test device 300 may comprise more, less or other units or modules which execute the functions of the test device 300 in the same manner as the units illustrated in FIG. 3.

It should be noted that FIG. 3 merely illustrates various functional units in the test device 300 in a logical sense. The functions in practice may be implemented using any suitable software and hardware means/circuits etc. Thus, the embodiments are generally not limited to the shown structures of the test device 300 and the functional units. Hence, the previously described exemplary embodiments may be realised in many ways. For example, one embodiment includes a computer-readable medium having instructions stored thereon that are executable by the control or processing unit 312 for executing the method steps in the test device 300. The instructions executable by the computing system and stored on the computer-readable medium perform the method steps of the test device 300 as set forth in the claims.

Figure 4:
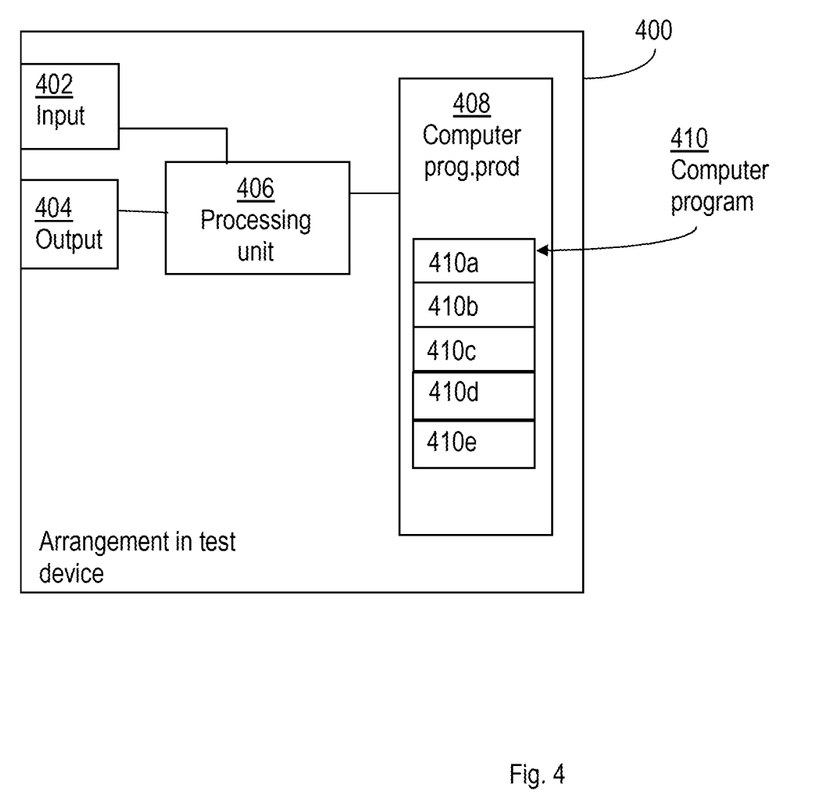
FIG. 4 is a block diagram of an arrangement in a test device adapted for determining characteristics of a metal cable suitable for use in a communication system according to an exemplifying embodiment.

FIG. 4 schematically shows an embodiment of an arrangement in a test device 400. Comprised in the test device 400 are here a processing unit 406, e.g. with a DSP (Digital Signal Processor). The processing unit 406 may be a single unit or a plurality of units to perform different actions of procedures described herein. The test device 400 may also comprise an input unit 402 for receiving signals from the metal cable, and an output unit 404 for providing signal(s) to the metal cable. The input unit and the output unit may be arranged as an integrated entity or as illustrated in the example of FIG. 3, as one or more interfaces 301/302.

Furthermore, the test device 400 comprises at least one computer program product 408 in the form of a non-volatile memory, e.g. an EEPROM (Electrically Erasable Programmable Read-Only Memory), a flash memory and a hard drive. The computer program product 408 comprises a computer program 410, which comprises code means, which when executed in the processing unit 406 in the test device 400 causes the test device 400 to perform the actions e.g. of the procedure described earlier in conjunction with FIGS. 1a and 1b.

The computer program 410 may be configured as a computer program code structured in computer program modules 410a-410e. Hence, in an exemplifying embodiment, the code means in the computer program of the test device 400 comprises a transmitting unit, or module, for transmitting a test signal on the cable. The computer program further comprises a receiving unit, or module, for receiving a reflected signal as a result of the wideband signal. The computer program further comprises a determining unit, or module, for determining an interval of the received reflected signal to be analysed, the interval corresponding to a part of the cable length. Still further, the computer program comprises an approximating unit, or module, for approximating the received reflected signal within the interval by a regression model, wherein the determining unit, or module, of the computer program determines communication characteristics of the cable based on the regression model.

The computer program modules could essentially perform the actions of the flow illustrated in FIGS. 1a and 1b, to emulate the test device 400. In other words, when the different computer program modules are executed in the processing unit 406, they may correspond to the units 304-311 of FIG. 3.

Although the code means in the embodiments disclosed above in conjunction with FIG. 3 are implemented as computer program modules which when executed in the processing unit causes the test device to perform the actions described above in the conjunction with figures mentioned above, at least one of the code means may in alternative embodiments be implemented at least partly as hardware circuits.

The processor may be a single CPU (Central processing unit), but could also comprise two or more processing units. For example, the processor may include general purpose microprocessors; instruction set processors and/or related chips sets and/or special purpose microprocessors such as ASICs (Application Specific Integrated Circuit). The processor may also comprise board memory for caching purposes. The computer program may be carried by a computer program product connected to the processor. The computer program product may comprise a computer readable medium on which the computer program is stored. For example, the computer program product may be a flash memory, a RAM (Random-access memory) ROM (Read-Only Memory) or an EEPROM, and the computer program modules described above could in alternative embodiments be distributed on different computer program products in the form of memories within the test device.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

While the embodiments have been described in terms of several embodiments, it is contemplated that alternatives, modifications, permutations and equivalents thereof will become apparent upon reading of the specifications and study of the drawings. It is therefore intended that the following appended claims include such alternatives, modifications, permutations and equivalents as fall within the scope of the embodiments and defined by the pending claims.

REFERENCES

1. "Detection of abrupt changes: theory and application", Michêle Basseville and Igor Vladimirovich Nikiforov, Prentice Hall, 1993, 2. "On the Use of Windows for Harmonic Analysis with the Discrete Fourier Transform", Proceedings of the IEEE, vol. 66, no. 1, January 1978.
3. "Transmission Line Zo vs. Frequency", Brooke Clarke, N6GCE 2003-2007, http://www.prc68.com/l/Zo.shtml

The invention claimed is:

1. A method for determining communication characteristics of a metal cable suitable for use in a communication system, comprising:
    transmitting a wideband test signal on the metal cable;
    receiving an reflected signal as a result of the wideband test signal;
    determining an interval of the received reflected signal to be analysed, the interval corresponding to a part of the metal cable length;
    approximating the received reflected signal within the interval by a regression model; and
    determining communication characteristics of the metal cable based on the regression model, wherein the regression model is defined by a regression function, $f(x)=C_1 x+C_2$.

2. The method according to claim 1, wherein the communication characteristics is at least one of attenuation and homogeneity.

3. The method according to claim 1, wherein the regression model is a linear regression function.

4. The method according to claim 1, wherein determining the communication characteristics comprises determining an attenuation per length unit of the cable neglecting polynomial terms of higher order than one.

5. The method according to claim 1, further comprising:
    estimating the value of $f(x)$ for a cable length of zero, i.e. $f(0)$; and
    determining the communication characteristics of the cable based on the value of $f(0)$.

6. The method according to claim 5, further comprising:
    compensating for an impedance mismatch between the metal cable and a measurement arrangement, where the measurement arrangement is used for performing the method.

7. The method according to claim 1, wherein determining the interval comprises determining a noise floor level, wherein the interval is determined within a part of the received reflected signal above the noise floor level.

8. The method according to claim 1, further comprising:
    finding peeks and/or dips in the received reflected signal corresponding to a joint or an end point of the cable; and
    removing said peeks and/or dips from the received reflected signal before approximating the received reflected signal within the interval by the regression model.

9. The method according to claim 1 further comprising:
    processing the reflected signal either in time or frequency domain before determining the interval of the reflected signal to be analysed.

10. The method according to claim 1, further comprising:
    determining a residual of the regression model and a variance of the determined residual.

11. The method according to claim 10, further comprising:
    determining a normalized impedance profile based on the variance of the residual.

12. The method according to claim 1, wherein the test signal is one of a Time Domain Reflectometry (TDR) pulse, frequency swept sinus wave signal, pseudo-random noise signal, and a multicarrier signal with random phase.

13. The method according to claim 1, further comprising:
determining, based on the regression model, whether the metal cable comprises one segment or at least two distinct segments differing in at least one of attenuation and homogeneity.

14. A test device for determining communication characteristics of a metal cable suitable for use in a communication system, the test device comprising:
a processor and non-transitory computer-readable medium having instructions stored thereon that are executable by the processor, the instructions including:
a transmitting unit adapted for transmitting a test signal on the metal cable;
a receiving unit adapted for receiving an reflected signal as a result of the test signal;
a determining unit adapted for determining an interval of the received reflected signal to be analysed, the interval corresponding to a part of the metal cable length; and
an approximating unit adapted for approximating the received reflected signal within the interval by a regression model,
wherein the determining unit further is adapted for determining communication characteristics of the cable based on the regression model, wherein the regression model is defined by a regression function, $f(x)=C_1x+C_2$.

15. The test device according to claim 14, wherein the communication characteristics is at least one of attenuation and homogeneity.

16. The test device according to claim 14, wherein the regression model is a linear function.

17. The test device according to claim 14, wherein the test signal is a wideband signal.

18. The test device according to claim 14, wherein the determining unit is adapted for determining the communication characteristics by determining an attenuation per length unit of the cable neglecting polynomial terms of higher order than one.

19. The test device according to claim 14, further comprising:
an estimating unit adapted for estimating the value of f(x) for a cable length of zero, i.e. f(0), wherein the determining unit is adapted for determining the communication characteristics of the cable based on the value of f(0).

20. The test device according to claim 19, further comprising:
a compensating unit adapted for compensating for an impedance mismatch between the metal cable and a measurement arrangement, wherein the measurement arrangement is the test device.

21. The test device according to claim 14, wherein the determining unit is adapted for determining the interval by determining a noise floor level, and wherein the interval is determined within a part of the received reflected signal above the noise floor level.

22. The test device according to claim 14, further comprising:
a finding unit adapted for finding peeks and/or dips in the received reflected signal corresponding to a joint or an end point of the cable and for removing said peeks and/or dips from the received reflected signal before the approximating unit approximates the received reflected signal within the interval by the regression model.

23. The test device according to claim 14 further comprising:
a signal processing unit adapted for signal processing either in time or frequency domain of the received reflected signal before the determining unit determines the interval of the received reflected signal to be analysed.

24. The test device according to claim 14, wherein the determining unit is adapted for determining a residual of the regression model and a variance of the determined residual.

25. The test device according to claim 24, wherein the determining unit is adapted for determining a normalized impedance profile based on the variance of the residual.

26. The test device according to claim 14, wherein the test signal is one of a Time Domain Reflectometry (TDR) pulse, frequency swept sinus wave signal, pseudo-random noise signal, and multicarrier signal with random phase.

27. The test device according to claim 14, wherein the determining unit is adapted for determining, based on the regression model, whether the metal cable comprises one segment or at least two distinct segments differing in at least one of attenuation and homogeneity.

28. A non-transitory computer-readable storage medium having instructions stored therein, which when executed by a processor, cause the processor to perform a method for determining communication characteristics of a metal cable suitable for use in a communication system, comprising:
transmitting a wideband test signal on the metal cable;
receiving an reflected signal as a result of the wideband test signal;
determining an interval of the received reflected signal to be analysed, the interval corresponding to a part of the metal cable length;
approximating the received reflected signal within the interval by a regression model; and
determining communication characteristics of the metal cable based on the regression model, wherein the regression model is defined by a regression function, $f(x)=C_1x+C_2$.

* * * * *